US011664650B2

(12) United States Patent
Harms et al.

(10) Patent No.: US 11,664,650 B2
(45) Date of Patent: May 30, 2023

(54) SYSTEMS FOR DETECTING FAILURES OR FAULTS IN POWER CONVERSION EQUIPMENT

(71) Applicant: GOODRICH CORPORATION, Charlotte, NC (US)

(72) Inventors: Scott Harms, Ypsilanti, ND (US); Rodrigo Fernandez-Mattos, Cheswick Green (GB); Mohamed J. Abdille, Jamestown, ND (US); Leeroy Paskell, Leicester (GB)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 17/462,697

(22) Filed: Aug. 31, 2021

(65) Prior Publication Data
US 2023/0065662 A1 Mar. 2, 2023

(51) Int. Cl.
*H02H 3/08* (2006.01)
*H02H 1/06* (2006.01)
*H02H 3/093* (2006.01)

(52) U.S. Cl.
CPC ............ *H02H 3/083* (2013.01); *H02H 1/063* (2013.01); *H02H 3/093* (2013.01)

(58) Field of Classification Search
CPC ......... H02H 3/083; H02H 3/093; H02H 1/063
See application file for complete search history.

(56) References Cited

U.S. PATENT DOCUMENTS

| 5,265,002 | A | 11/1993 | Bando et al. |
|---|---|---|---|
| 8,437,904 | B2 | 5/2013 | Mansouri et al. |
| 9,837,917 | B1* | 12/2017 | Furtner ............ H02M 3/33523 |
| 10,080,273 | B1 | 9/2018 | Slivka et al. |
| 10,643,187 | B2 | 5/2020 | Barkat et al. |
| 10,768,242 | B1 | 9/2020 | Kitchin et al. |
| 2012/0016531 | A1 | 1/2012 | Ganev et al. |
| 2014/0307490 | A1* | 10/2014 | Sagona ............... H02H 7/1252 363/52 |
| 2017/0047744 | A1* | 2/2017 | Kim .................... H02M 1/4225 |
| 2019/0334439 | A1* | 10/2019 | Owshanko ........ H02M 3/33576 |
| 2020/0321878 | A1* | 10/2020 | Zhang .................. H02M 7/483 |

FOREIGN PATENT DOCUMENTS

CN 112623267 4/2021

OTHER PUBLICATIONS

European Patent Office, European Search Report dated Feb. 20, 2023 in Application No. 22193087.8.

* cited by examiner

*Primary Examiner* — Scott Bauer
(74) *Attorney, Agent, or Firm* — Snell & Wilmer L.L.P.

(57) ABSTRACT

A system for detecting a fault in electric power conversion equipment having an input stage and an output stage includes an output voltage sensor positioned within the output stage and configured to generate an output voltage signal; an input current sensor positioned at the input stage and configured to generate an input current signal; and a processor configured to analyze the output voltage signal and the input current signal to determine an occurrence of the fault in the electric power conversion equipment.

18 Claims, 6 Drawing Sheets

SYSTEMS FOR DETECTING FAILURES OR FAULTS IN POWER CONVERSION EQUIPMENT

FIELD

The present disclosure relates generally to power conversion equipment and, more particularly, to systems used to monitor and detect the occurrence of failures or faults in power conversion equipment used for aircraft.

BACKGROUND

Equipment connected to an aircraft electrical network must comply with power quality requirements as defined in relevant specifications or regulations. For example, alternating current (AC) equipment must not only be able to satisfy equipment requirements, such as output voltage, load capability, output ripple and dynamic performance, but also power quality requirements, such as power factor, current harmonics, input voltage range and frequency variations. Furthermore, aircraft manufacturers have recently set specific limits applied to failure or fault conditions to key power quality parameters, such as power factor, total harmonic distortion, current unbalance and common mode noise. These limits may not be exceeded as such failure or fault characteristics in the AC equipment can cause disturbances to the electrical network that might adversely affect safety critical equipment connected to the network, or even the network itself. Accordingly, it is beneficial if the AC equipment is capable of determining whether any of the limits has been exceeded. To do so, the AC equipment should be capable of measuring or monitoring the input current, the input voltage, the output current and the output voltage. Raw data obtained from such monitoring is typically conditioned and processed digitally to calculate the real-time power factor, total harmonic distortion of the current, etc. In order to calculate these parameters in real-time, there is a significant level of signal processing required. If a threshold limit is exceeded, it is beneficial if the AC equipment is able to report the exceeded threshold limit and to self-disconnect from the electrical network. Techniques and equipment for digital monitoring or analyzing such real-time data can be complicated and expensive. Simplification of such techniques and equipment is beneficial at a project level from several perspectives, including reduced complexity and expense.

SUMMARY

A system for detecting a fault in electric power conversion equipment having an input stage and an output stage is disclosed. In various embodiments, the system includes an output voltage sensor positioned within the output stage and configured to generate an output voltage signal; an input current sensor positioned at the input stage and configured to generate an input current signal; and a processor configured to analyze the output voltage signal and the input current signal to determine an occurrence of the fault in the electric power conversion equipment. In various embodiments, the output voltage sensor is a direct current voltage sensor. In various embodiments, the input current sensor is a three-phase alternating current sensor.

In various embodiments, the processor includes a scaler configured to scale the output voltage signal and to generate a scaled output voltage signal. In various embodiments, the processor includes a first signal isolator configured to receive the scaled output voltage signal and to generate a scaled and isolated output voltage signal. In various embodiments, the processor includes a first detection circuit, the first detection circuit including the scaler, the first signal isolator, a high pass filter, a first comparator, a rectifier and timing circuit and a second comparator, the first detection circuit configured to receive the output voltage signal and determine whether an output voltage excursion at the output stage has occurred. In various embodiments, the processor includes a second detection circuit, the second detection circuit including the scaler, the first signal isolator and a third comparator, the second detection circuit configured to receive the output voltage signal and determine whether an overload and loss of output at the output stage has occurred. In various embodiments, each component comprising the first detection circuit and the second detection circuit is an analog component.

In various embodiments, the processor includes a second signal isolator configured to receive the input current signal and to generate an isolated input current signal. In various embodiments, the processor includes a third detection circuit, the third detection circuit including the second signal isolator, a rectifier and averaging circuit, a differential amplifier and a fourth comparator, the third detection circuit configured to receive the input current signal and determine whether an unbalanced phase current has occurred. In various embodiments, the processor includes a fourth detection circuit, the fourth detection circuit including the second signal isolator and a fifth comparator, the fourth detection circuit configured to receive the input current signal and determine whether an input current exceedance has occurred. In various embodiments, each component comprising the third detection circuit and the fourth detection circuit is an analog component.

A transformer rectifier unit having an input stage, a transformer stage, a rectifier stage and an output stage is disclosed. In various embodiments, the transformer rectifier unit includes an output voltage sensor positioned within the output stage and configured to generate an output voltage signal; an input current sensor positioned at the input stage and configured to generate an input current signal; and a processor configured to analyze the output voltage signal and the input current signal to determine an occurrence of a fault in one or more of the input stage, the transformer stage, the rectifier stage and the output stage. In various embodiments, the output voltage sensor is a direct current voltage sensor and the input current sensor is a three-phase alternating current sensor.

In various embodiments, the processor includes a first detection circuit, the first detection circuit including a scaler, a first signal isolator, a high pass filter, a first comparator, a rectifier and a second comparator, the first detection circuit configured to receive the output voltage signal and determine whether an output voltage excursion at the output stage has occurred. In various embodiments, the processor includes a second detection circuit, the second detection circuit including the scaler, the first signal isolator and a third comparator, the second detection circuit configured to receive the output voltage signal and determine whether an overload and loss of output at the output stage has occurred. In various embodiments, each component comprising the first detection circuit and the second detection circuit is an analog component.

In various embodiments, the processor includes a third detection circuit, the third detection circuit including a second signal isolator, a rectifier and averaging circuit, a differential amplifier and a fourth comparator, the third detection circuit configured to receive the input current signal and determine whether an unbalanced phase current has occurred. In various embodiments, the processor includes a fourth detection circuit, the fourth detection circuit including the second signal isolator and a fifth comparator, the fourth detection circuit configured to receive the input current signal and determine whether an input current exceedance has occurred. In various embodiments, each component comprising the third detection circuit and the fourth detection circuit is an analog component.

A method for detecting a fault in electric power conversion equipment having an input stage and an output stage is disclosed. In various embodiments, the method includes the steps of generating an output voltage signal via an output voltage sensor positioned within the output stage; generating an input current signal via an input current sensor positioned at the input stage; and determining an occurrence of the fault in the electric power conversion equipment via a processor configured to analyze the output voltage signal and the input current signal, where determining the occurrence of the fault includes one or more of: receiving the output voltage signal and determining whether an output voltage excursion at the output stage has occurred, receiving the output voltage signal and determining whether an overload and loss of output at the output stage has occurred, receiving the input current signal and determining whether an unbalanced phase current has occurred and receiving the input current signal and determining whether an input current exceedance has occurred.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

The following disclosure presents a system in which, rather than digitally processing raw data to determine directly if a specific power quality limit has been exceeded, actual time domain monitoring of the raw data is used to deduce or determine indirectly that a limit has been exceeded. In various embodiments, a failure mode effect analysis (FMEA) is used to establish what faults within the equipment (e.g., an AC-DC converter) will cause a limit or a plurality of limits to be exceeded with the behavior of the equipment being used to detect the fault. FMEA may be used to determine the likelihood of a fault occurring, the impact of the fault and how it can be detected and accommodated when and if such fault does occur.

Figure 1:
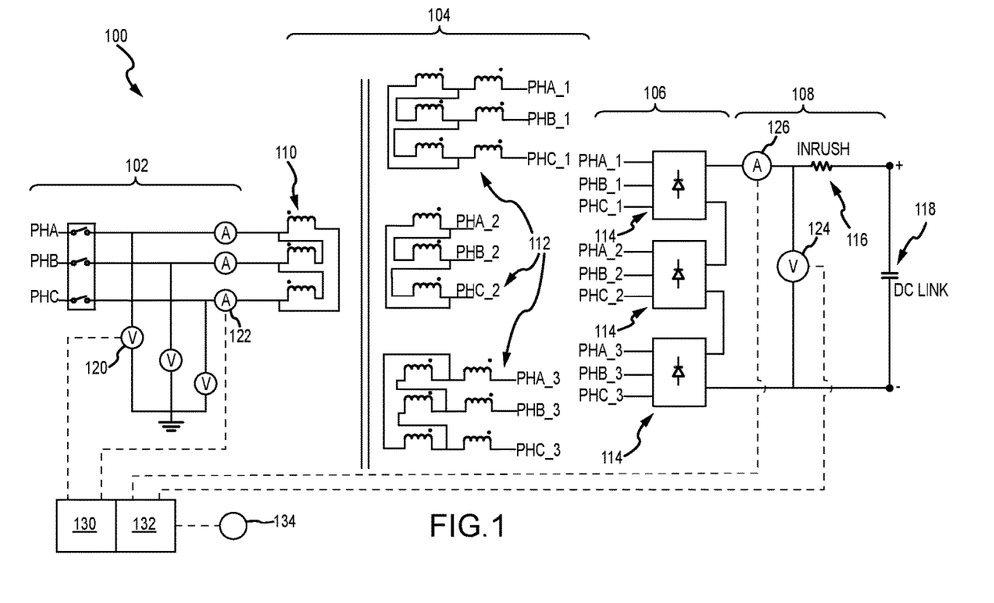
FIG. 1 provides a schematic view of a system level architecture for a transformer rectifier unit, in accordance with various embodiments.

Referring now to the drawings, FIG. 1 schematically illustrates a system level architecture for a transformer rectifier unit 100, in accordance with various embodiments. The transformer rectifier unit 100 is configured to receive an input alternating current (AC) voltage at an input stage 102. The voltage level of the input AC voltage is then transformed (or changed) at a transformer stage 104, comprising a primary winding 110 and a series of secondary windings 112, to generate a transformed AC voltage. The transformed AC voltage is then rectified at a rectifier stage 106, comprising a series of diodes 114, to generate a direct current (DC) voltage, which is then provided as a DC voltage at an output stage 108, which may include an inrush circuitry 116 and a DC Link circuitry 118. In various embodiments, typical of an aircraft, the input AC voltage is either three-phase 230 Vrms or 115 Vrms and the output DC voltage is either 270 V or 540 V, although other voltages are contemplated for both the input AC voltage and the output DC voltage. Various sensors may be positioned at the input stage 102 and at the output stage 108 and used to measure or sense the voltages and currents described above. For example, an input voltage sensor 120 and an input current sensor 122 may be located on the circuitry comprising the input stage 102 and configured to measure or sense the three input voltages and currents at the input stage 102 and to generate an input current signal (or signals) and an input voltage signal (or signals) reflective of the three input voltages and currents at the input stage 102. Similarly, an output voltage sensor 124 and an output current sensor 126 may be located on the circuitry comprising the output stage 108 and configured to measure or sense the output voltage and current at the output stage 108 and to generate an output current signal and an output voltage signal reflective of the output voltage and current at the output stage 108. In various embodiments, the output voltage sensor 124 is a direct current voltage sensor and the input current sensor 122 is a three-phase alternating current sensor (or sensors).

In various embodiments, and as will be discussed further below, a processor 130 may also be employed with the transformer rectifier unit 100 and configured to measure or monitor the three AC voltage levels (V) and the three AC current levels (A) at the input stage 102 and the DC voltage level (V) and the DC current level (A) at the output stage 108. In various embodiments, the processor 130 may also include a memory 132 configured to store a table that includes a failure mode effect analysis (FMEA) as described in further detail below, although in analog processor designs, the memory 132 is not generally necessary for inclusion. The processor 130 will typically be configured to receive input signals from each of the input voltage sensor 120 (or input voltage sensors) and the input current sensor 122 (or input current sensors) located on the circuitry comprising the input stage 102 and the output voltage sensor 124 and the output current sensor 126 located on circuitry comprising the output stage 108. In various embodiments, the processor 130 may include a general-purpose processor, a digital signal processor (DSP), an application specific integrated circuit (ASIC), a field programmable gate array (FPGA) or some other programmable logic device, discrete gate or transistor logic, discrete hardware components, or any combination thereof. Or, in various embodiments, the processor 130 may comprise purely analog circuitry, configured to monitor the various voltage and current levels at the input stage 102 and the output stage 108, or a combination of analog and digital circuitry. The memory 132 will typically comprise a tangible, non-transitory, computer-readable medium in digital form; as noted above, with purely analog circuitry, a digital memory is not typically required. An output device 134 (e.g., an audio signal, a light signal or a computer screen output or any other manner of communication or signaling via, for example, a serial data bus) may be in communication with the processor 130 and configured to output signals or messages illustrative of the status (e.g., failures or faults) of the various components comprising the transformer rectifier unit 100.

Figure 2A:
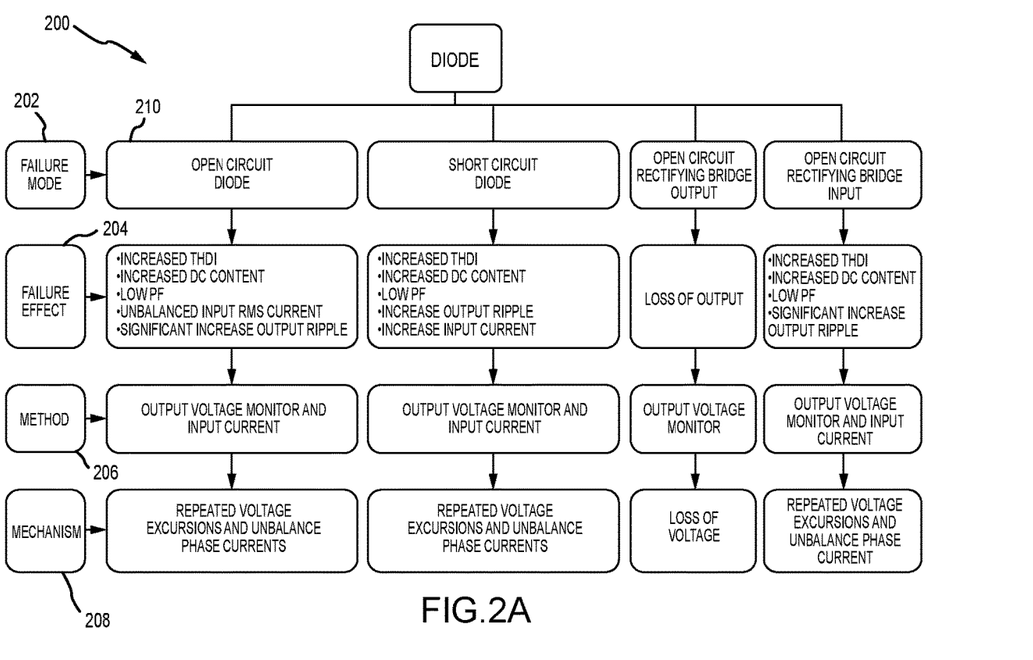
FIGS. 2A and 2B provide charts illustrating a failure mode effect analysis for various components comprising the transformer rectifier unit illustrated in FIG. 1, in accordance with various embodiments.
Figure 2B:
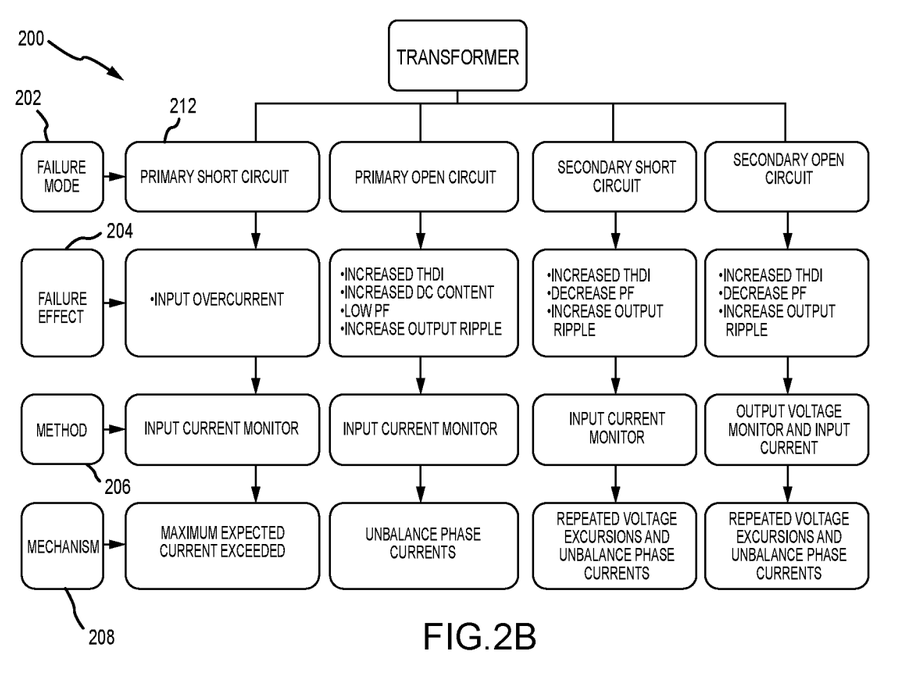

Referring now to FIGS. 2A and 2B, charts are provided that illustrate a FMEA for various components comprising the transformer rectifier unit 100 illustrated in FIG. 1. Referring to FIG. 2A, for example, a FMEA 200 is provided for the diodes comprising the rectifier stage 106. As illustrated, the FMEA 200 includes entries for a failure mode 202, a failure effect 204, a failure detect method 206 and a failure detect mechanism 208. By way of example, in the case where the failure mode 202 is an open circuit failure 210 (or fault) of a diode within the rectifier stage 106, the failure effect 204 includes one or more of an increased total harmonic distortion of the current (THDI), an increase in the output DC voltage, a low power factor (PF), an unbalance of the input current and an increase in the output ripple. The failure effect 204 is detectable and may be detected at the failure detect method 206 by monitoring the output voltage (V) at the output stage 108 and the input current (A) at the input stage 102. Such monitoring of the output voltage (V) at the output stage 108 and the input current (A) at the input stage 102 may be performed via the processor 130. The open circuit failure 210 manifests itself at the failure detect mechanism 208 via repeated voltage excursions at the output stage 108 and an unbalance in the phase currents at the input stage 102. As illustrated at FIG. 2B, the FMEA 200 may be expanded to include the failure mode 202, the failure effect 204, the failure detect method 206 and the failure detect mechanism 208 for the components comprising the transformer stage 104. For example, a fault within a primary short circuit 212 may be detected in a manner similar to detecting the open circuit failure 210 (or fault) described above by monitoring the input current (A) at the input stage 102. In various embodiments, additional components of the transformer rectifier unit 100, such as the inrush circuitry 116 and the DC Link circuitry 118 at the output stage 108 or any electromagnetic filtering circuitry at the input stage 102 may be added to the FMEA 200 as considered appropriate.

Figure 3A:
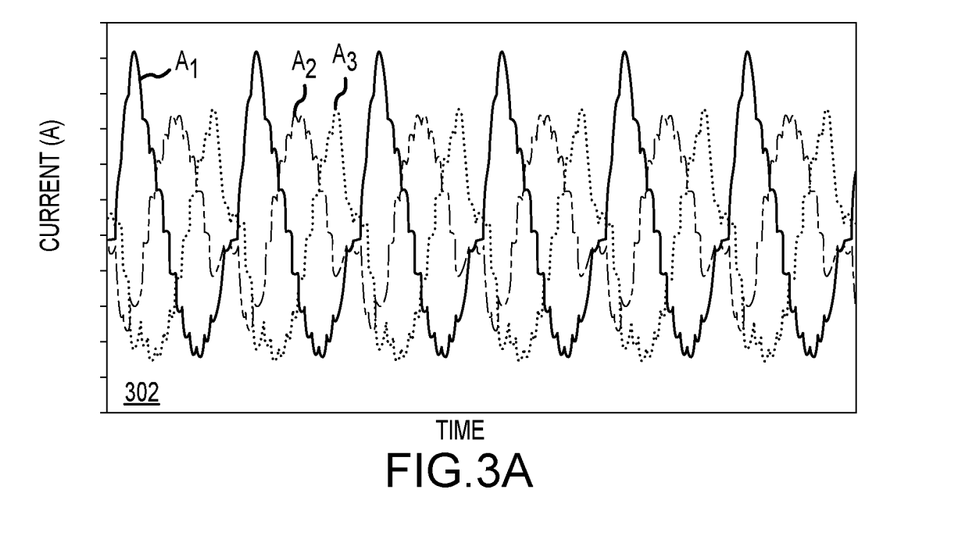
FIGS. 3A and 3B provide simulated results for input current and output voltage for a fault concerning an open circuit of a diode within a rectifier stage of the transformer rectifier unit illustrated in FIG. 1, in accordance with various embodiments.
Figure 3B:
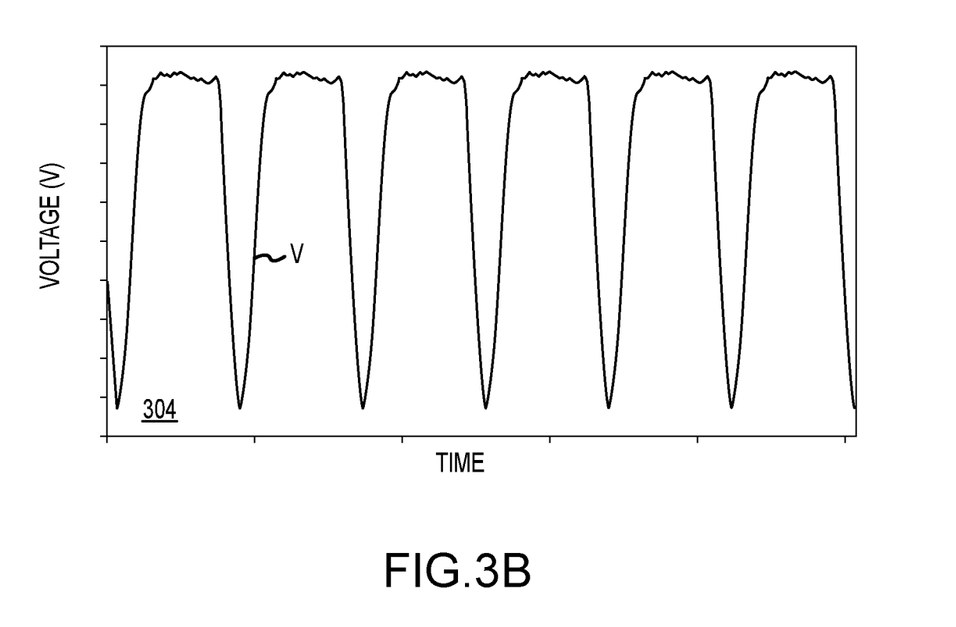

Referring now to FIGS. 3A and 3B, a first graph 302 illustrating the three current levels (A) at the input stage 102 and a second graph 304 illustrating the DC voltage level (V) at the output stage 108 are provided for a simulated occurrence of the fault concerning the open circuit failure 210 of a diode within the rectifier stage 106 described above. As illustrated in the first graph 302, the three AC current levels $(A_1, A_2, A_3)$ indicate the unbalance in the phase currents at the input stage 102 and, as illustrated in the second graph 304, the voltage level (V) indicates the repeated excursions of the DC voltage (V) at the output stage 108. Monitoring of other observables from the failure effect 204, such as the total harmonic distortion of the current, the power factor and the output ripple, may be made based on the detectable characteristics of one or more of the three AC voltage levels (V) and the three AC current levels (A) at the input stage 102 and the DC voltage level (V) and the DC current level (A) at the output stage 108. Monitoring of the voltage and the current levels at the input stage 102 and the output stage 108, which is performed via the processor 130 analyzing the signals received from one or more of the input voltage sensor 120 (or sensors), the input current sensor 122 (or sensors), the output voltage sensor 124 and the output current sensor 126, allows the processor to determine a specific failure or fault or a range of possible failures or faults occurring within the transformer rectifier unit 100, by comparing the detectable characteristics against the normal operating conditions. For example, if the detection circuit during normal operation produces an output between two voltages, an output of the detection circuit outside the boundary of the two voltages indicates an occurrence of a fault.

Figure 4:
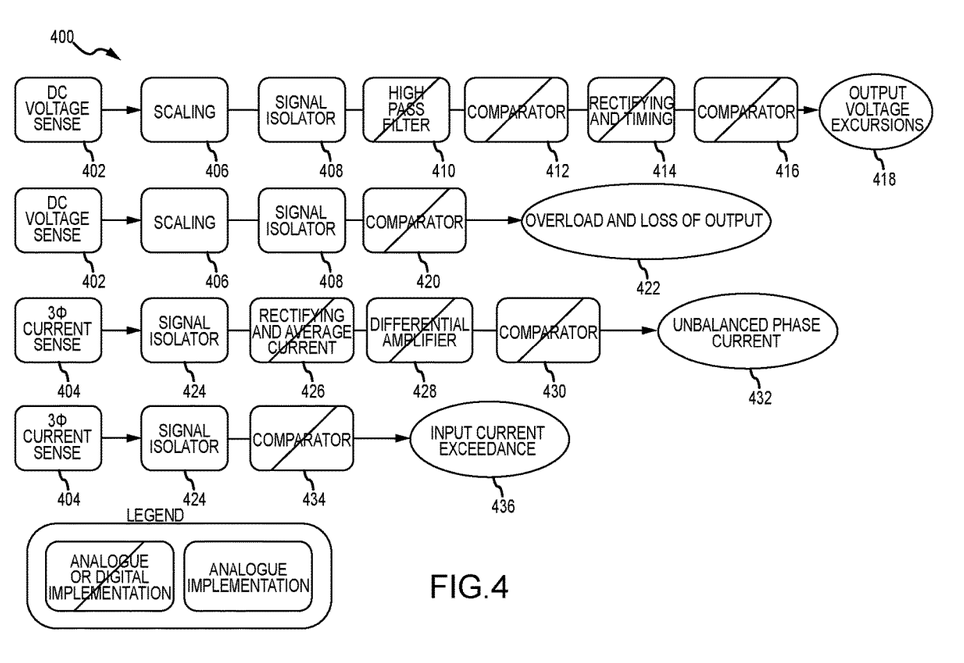
FIG. 4 illustrates a system for detecting a failure or a fault in electrical equipment, such as the transformer rectifier unit illustrated in FIG. 1, in accordance with various embodiments.

Referring now to FIG. 4, a system 400 for detecting a fault in electric power conversion equipment (e.g., the transformer rectifier unit 100 described above) is illustrated. In various embodiments, the system 400 includes an output voltage sensor 402 (e.g., the output voltage sensor 124 described above) and an input current sensor 404 (e.g., the input current sensor 122 (or input current sensors) described above). The signals received from the output voltage sensor 402 may be scaled by a scaler 406 to produce a scaled output voltage signal and then isolated by a first signal isolator 408 to produce a scaled and isolated output voltage signal. In a first detection circuit, the scaled and isolated output voltage signal is passed through a high pass filter 410 to filter out low-frequency components of the scaled and isolated output voltage signal. The filtered signal is then compared against a first reference signal via a first comparator 412 to determine whether the DC voltage represented by the filtered signal is greater than or less than the first reference signal. If greater than the first reference signal, the filtered signal is then rectified and time delayed by a rectifier and timing circuit 414 and passed to a second comparator 416 to determine whether the DC voltage represented by the filtered, rectified and time delayed signal is greater than or less than a second reference signal. If greater than the second reference signal, an output voltage excursion 418 (e.g., the excursion illustrated at FIG. 3B) is detected and reported via an output device (e.g., the output device 134 described above). In a second detection circuit, the scaled and isolated signal is passed to a third comparator 420 to determine whether the DC voltage represented by the filtered signal is greater than or less than a second reference signal. If less than the second reference signal, an overload and loss of output 422 is detected and reported via the output device.

Still referring to FIG. 4, the signals received from the input current sensor 404 (three signals, one for each of the three phases) are isolated by a second signal isolator 424 to produce an isolated input current signal (or a first isolated input current signal, a second isolated input current signal and a third isolated input current signal). In a third detection circuit, the isolated input current signals are then rectified and averaged via a rectifier and averaging circuit 426 to produce three isolated, rectified and averaged input current signals. These three signals are then passed to a differential amplifier 428 to amplify any voltage differences and suppress any common voltages between the three signals. The three signals are then compared via a fourth comparator 430. If the comparator determines the three signals are not the same, an unbalanced phase current 432 of the three input signals is detected and reported via the output device. In a fourth detection circuit, the isolated input signals are passed to a fifth comparator 434 to determine whether any of the three isolated input current signals is greater than or less than a fourth reference signal. If any of the signals exceeds the fourth reference signal, an input current exceedance 436 is detected and reported via the output device.

Various benefits of the foregoing disclosure, including the system 400 just described, may be realized. For example, a significant reduction in development cost (e.g., design, verification and qualification) may be realized through the simplicity of the various components that comprise the system 400. In various embodiments, the reduction in development cost is realized through use of analog circuitry or analog components in the processor (e.g., the processor 130 described with reference to FIG. 1) rather than more complex and costly digital signal processing circuitry, which typically requires costly and time-consuming programming efforts to implement. Even where a combination of analog circuitry and digital components are employed, as indicated in FIG. 4, a significant reduction in complexity may be realized over a purely digital design. In addition, while the system 400 and the various embodiments disclosed herein are generally described in relation to a transformer rectifier unit (e.g., the transformer rectifier unit 100 described with reference to FIG. 1), the concepts described herein are applicable to other power conversion equipment. In various embodiments, for example, a FMEA may be constructed for most AC-DC convertors, DC-AC convertors, DC-DC convertors and AC-AC convertors, with the data reflected in any such FMEA incorporated into the processor employed to monitor the power conversion equipment, as described throughout this disclosure. Hence, the disclosure should not be considered as limited to the transformer rectifier units described herein, but should be considered applicable for power conversion equipment generally.

Figure 5:
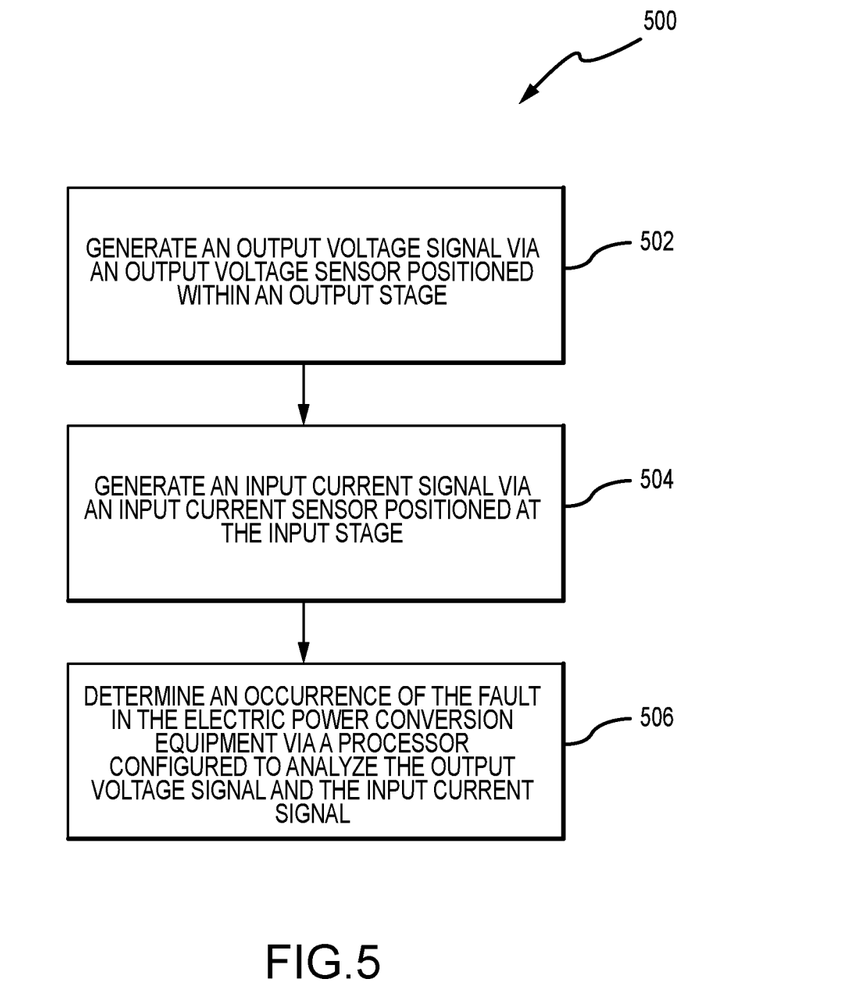
FIG. 5 describes a method for detecting a fault in electric power conversion equipment having an input stage and an output stage, in accordance with various embodiments.

Referring now to FIG. 5, a method 500 for detecting a fault in electric power conversion equipment having an input stage and an output stage is described as having the following steps. A first step 502 includes generating an output voltage signal via an output voltage sensor positioned within the output stage. A second step 504 includes generating an input current signal via an input current sensor positioned at the input stage. A third step 506 includes determining an occurrence of the fault in the electric power conversion equipment via a processor configured to analyze the output voltage signal and the input current signal. In various embodiments, the step of determining the occurrence of the fault by the processor includes one or more of: receiving the output voltage signal and determining whether an output voltage excursion at the output stage has occurred, receiving the output voltage signal and determining whether an overload and loss of output at the output stage has occurred, receiving the input current signal and determining whether an unbalanced phase current has occurred and receiving the input current signal and determining whether an input current exceedance has occurred.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

In various embodiments, system program instructions or controller instructions may be loaded onto a tangible, non-transitory, computer-readable medium (also referred to herein as a tangible, non-transitory, memory) having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media that were found by In Re Nuijten to fall outside the scope of patentable subject matter under 35 U.S.C. § 101.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Finally, any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A system for detecting a fault in electric power conversion equipment having an input stage and an output stage, comprising:
   an output voltage sensor positioned within the output stage and configured to generate an output voltage signal;
   an input current sensor positioned at the input stage and configured to generate an input current signal; and
   a processor configured to analyze the output voltage signal and the input current signal to determine an occurrence of the fault in the electric power conversion equipment, wherein the processor includes a first detection circuit, the first detection circuit including a scaler, a first signal isolator, a high pass filter, a first comparator, a rectifier and timing circuit and a second comparator, the first detection circuit configured to receive the output voltage signal and determine whether an output voltage excursion at the output stage has occurred.

2. The system of claim 1, wherein the output voltage sensor is a direct current voltage sensor.

3. The system of claim 2, wherein the input current sensor is a three-phase alternating current sensor.

4. The system of claim 1, wherein the scaler is configured to scale the output voltage signal and to generate a scaled output voltage signal.

5. The system of claim 4, wherein the first signal isolator is configured to receive the scaled output voltage signal and to generate a scaled and isolated output voltage signal.

6. The system of claim 5, wherein the processor includes a second detection circuit, the second detection circuit including the scaler, the first signal isolator and a third comparator, the second detection circuit configured to receive the output voltage signal and determine whether an overload and loss of output at the output stage has occurred.

7. The system of claim 6, wherein the processor includes a second signal isolator configured to receive the input current signal and to generate an isolated input current signal.

8. The system of claim 7, wherein the processor includes a third detection circuit, the third detection circuit including the second signal isolator, a rectifier and averaging circuit, a differential amplifier and a fourth comparator, the third detection circuit configured to receive the input current signal and determine whether an unbalanced phase current has occurred.

9. The system of claim 8, wherein the processor includes a fourth detection circuit, the fourth detection circuit including the second signal isolator and a fifth comparator, the fourth detection circuit configured to receive the input current signal and determine whether an input current exceedance has occurred.

10. The system of claim 7, wherein each component comprising the first detection circuit and the second detection circuit is an analog component.

11. The system of claim 9, wherein each component comprising the third detection circuit and the fourth detection circuit is an analog component.

12. A transformer rectifier unit having an input stage, a transformer stage, a rectifier stage and an output stage, comprising:
   an output voltage sensor positioned within the output stage and configured to generate an output voltage signal;
   an input current sensor positioned at the input stage and configured to generate an input current signal; and
   a processor configured to analyze the output voltage signal and the input current signal to determine an occurrence of a fault in one or more of the input stage, the transformer stage, the rectifier stage and the output stage,
   wherein the output voltage sensor is a direct current voltage sensor and the input current sensor in a three-phase alternating current sensor, and
   wherein the processor includes a first detection circuit, the first detection circuit including a scaler, a first signal isolator, a high pass filter, a first comparator, a rectifier and a second comparator, the first detection circuit configured to receive the output voltage signal and determine whether an output voltage excursion at the output stage has occurred.

13. The transformer rectifier unit of claim 12, wherein the processor includes a second detection circuit, the second detection circuit including the scaler, the first signal isolator and a third comparator, the second detection circuit configured to receive the output voltage signal and determine whether an overload and loss of output at the output stage has occurred.

14. The transformer rectifier unit of claim 13, wherein the processor includes a third detection circuit, the third detection circuit including a second signal isolator, a rectifier and averaging circuit, a differential amplifier and a fourth comparator, the third detection circuit configured to receive the input current signal and determine whether an unbalanced phase current has occurred.

15. The transformer rectifier unit of claim 14, wherein the processor includes a fourth detection circuit, the fourth detection circuit including the second signal isolator and a fifth comparator, the fourth detection circuit configured to receive the input current signal and determine whether an input current exceedance has occurred.

16. The transformer rectifier unit of claim 13, wherein each component comprising the first detection circuit and the second detection circuit is an analog component.

17. The transformer rectifier unit of claim 15, wherein each component comprising the third detection circuit and the fourth detection circuit is an analog component.

18. A method for detecting a fault in electric power conversion equipment having an input stage and an output stage, comprising:
generating an output voltage signal via an output voltage sensor positioned within the output stage;
generating an input current signal via an input current sensor positioned at the input stage; and
determining an occurrence of the fault in the electric power conversion equipment via a processor, and through a detection circuit of the processor, the detection circuit including a scaler, a first signal isolator, a high bypass filter, a first comparator, a rectifier, and a second comparator, the detection circuit configured to analyze the output voltage signal and the input current signal,
wherein determining the occurrence of the fault includes one or more of:
receiving the output voltage signal and determining whether an output voltage excursion at the output stage has occurred,
receiving the output voltage signal and determining whether an overload and loss of output at the output stage has occurred,
receiving the input current signal and determining whether an unbalanced phase current has occurred and
receiving the input current signal and determining whether an input current exceedance has occurred.

* * * * *